US009129921B2

(12) United States Patent
Sasaki

(10) Patent No.: US 9,129,921 B2
(45) Date of Patent: Sep. 8, 2015

(54) METHOD OF MANUFACTURING NITRIDE SEMICONDUCTOR DEVICE, AND BURN-IN APPARATUS

(71) Applicant: Mitsubishi Electric Corporation, Tokyo (JP)

(72) Inventor: Hajime Sasaki, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/276,059

(22) Filed: May 13, 2014

(65) Prior Publication Data
US 2015/0064811 A1  Mar. 5, 2015

(30) Foreign Application Priority Data

Aug. 30, 2013 (JP) .................................. 2013-179408

(51) Int. Cl.
  *H01L 21/324* (2006.01)
  *H01L 21/66* (2006.01)
(52) U.S. Cl.
  CPC ............ *H01L 21/3245* (2013.01); *H01L 22/26* (2013.01)
(58) Field of Classification Search
  CPC ........................................................ G05F 3/02
  USPC .......................................... 365/185; 330/126
  See application file for complete search history.

(56) References Cited

U.S. PATENT DOCUMENTS

| 4,851,764 | A  | * | 7/1989  | Usui ......................... 324/750.09 |
| 6,586,781 | B2 | * | 7/2003  | Wu et al. ......................... 257/194 |
| 8,421,122 | B2 | * | 4/2013  | Smith et al. .................... 257/194 |
| 8,797,103 | B2 | * | 8/2014  | Kaczman et al. .............. 330/307 |
| 2005/0218923 | A1 |  | 10/2005 | Kutsuna |
| 2006/0219534 | A1 | * | 10/2006 | Matsuda ..................... 200/43.16 |
| 2007/0114569 | A1 |  | 5/2007  | Wu et al. |
| 2012/0049973 | A1 | * | 3/2012  | Smith et al. ................... 333/103 |
| 2012/0224433 | A1 | * | 9/2012  | Mochida .................. 365/185.27 |
| 2013/0093510 | A1 | * | 4/2013  | Watanabe ..................... 330/107 |
| 2014/0295635 | A1 |  | 10/2014 | Sasaki |

FOREIGN PATENT DOCUMENTS

JP       62-267676 A    11/1987
JP      2000-174292 A    6/2000
(Continued)

OTHER PUBLICATIONS

Microelectronics Reliability, vol. 52, Issues 9-10, Sep.-Oct. 2012, pp. 2188-2193 D. Marcon, J. Viaene, P. Favia, H. Bender, X. Kang, S. Lenci, S. Stoffels, S. Decoutere.*
(Continued)

*Primary Examiner* — Yu-Hsi D Sun
*Assistant Examiner* — Chi-Hua Yang
(74) *Attorney, Agent, or Firm* — Leydig, Voit & Mayer, Ltd.

(57) ABSTRACT

A method of manufacturing a nitride semiconductor device, the nitride semiconductor device having an input terminal, a drain terminal, a gate terminal, and an output terminal, includes a burn-in step in which the nitride semiconductor device is heated while inputting an RF signal to the input terminal, applying a drain voltage to the drain terminal, and applying a gate voltage to the gate terminal. The burn-in step is continued until the nitride semiconductor device exhibits a decrease in gate current.

7 Claims, 2 Drawing Sheets

(56) References Cited

FOREIGN PATENT DOCUMENTS

| JP | 2009-507396 A | 2/2009 |
|---|---|---|
| WO | WO 2008/027027 A2 | 3/2008 |

OTHER PUBLICATIONS

A. R. Barnes, F. Vitobello : Preliminary Reliability Data from Accelerated RF Life Tests on European GaN HEMTsCs Mantech Conference, Apr. 23-26, 2012, Boston, Massachusetts, USA.*

D. Marcon, J. Viaene, P. Favia, H. Bender, X. Kang, S. Lenci, S. Stoffels, S. Decoutere, "Reliability of AlGaN/GaN HEMTs: permanent leakage current increase and output current drop" 2013 IEEE 978-1-4799-0480-8, p. 249-254.*

A. A R. Barnes, F. Vitobello : Preliminary Reliability Data from Accelerated RF Life Tests on European GaN HEMTsCs Mantech Conference, Apr. 23rd-26th, 2012, Boston, Massachusetts, USA.*

Olivier Jardel et al. "An Electrothermal Model for AlGaN/GaN Power HEMTs Including Trapping Effects to Improve Large-Signal Simulation Results on High VSW" p. 2660-1669, IEEE Transactions on Microwave Theory and Techniques, vol. 55, No. 12, Dec. 2007R.*

A. Chini et al. "Analysis of GaN HEMT Failure Mechanisms During DC and Large-Signal RF Operation", *IEEE Transactions on Electron Devices*, vol. 59, No. 5, pp. 1385-1392 (May 2012).

* cited by examiner

METHOD OF MANUFACTURING NITRIDE SEMICONDUCTOR DEVICE, AND BURN-IN APPARATUS

BACKGROUND OF THE INVENTION

1. Field of the Invention

The present invention relates to a method of manufacturing a nitride semiconductor device used, e.g., for amplifying high frequency signals, and also relates to a burn-in apparatus used in that method.

2. Background Art

Japanese Laid-Open Patent Publication No. S62-267676 discloses a technique in which a semiconductor device is burned-in using an evaluation apparatus. Alessandro Chini et al. disclose failure mechanisms of semiconductor devices which have been subjected to stress due to burn-in, etc. (see Alessandro Chini et al., "Analysis of GaN HEMT Failure Mechanisms During DC and Large-Signal RF Operation," IEEE TRANSACTIONS ON ELECTRON DEVICES, VOL. 59, NO. 5, May 2012, p. 1385).

A problem associated with nitride semiconductor devices has been that long-term use of a nitride semiconductor device results in a decrease in its output RF signal power and an increase in its gate current, making it impossible to provide a nitride semiconductor device having high reliability over long periods of operation.

SUMMARY OF THE INVENTION

The present invention has been made to solve this problem. It is, therefore, an object of the present invention to provide a method of manufacturing a nitride semiconductor device having superior long-term reliability. Another object of the present invention is to provide a burn-in apparatus used for manufacture of such nitride semiconductor devices.

The features and advantages of the present invention may be summarized as follows.

According to one aspect of the present invention, a method of manufacturing a nitride semiconductor device, the nitride semiconductor device having an input terminal, a drain terminal, a gate terminal, and an output terminal, the method includes a burn-in step wherein the nitride semiconductor device is heated while inputting an RF signal to the input terminal, applying a drain voltage to the drain terminal, and applying a gate voltage to the gate terminal, the burn-in step being continued until the nitride semiconductor device exhibits a decrease in gate current.

According to another aspect of the present invention, a burn-in apparatus includes an RF signal source for supplying an RF signal to a nitride semiconductor device, a tuner connected to an output of the nitride semiconductor device, a load connected to the tuner, and a control unit for measuring a gate current of the nitride semiconductor device while a drain voltage, a gate voltage, and the RF signal are being supplied to the nitride semiconductor device, and stopping the supply of the drain voltage, the gate voltage, and the RF signal to the nitride semiconductor device upon detection of a decrease in the gate current.

Other and further objects, features and advantages of the invention will appear more fully from the following description.

DETAILED DESCRIPTION OF THE PREFERRED EMBODIMENTS

First Embodiment

Figure 1:
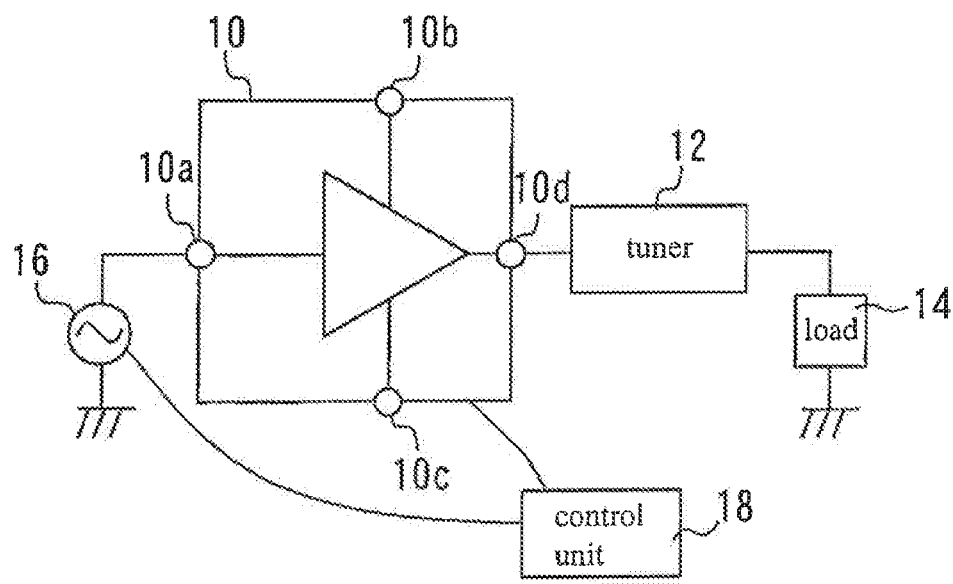
FIG. 1 is a diagram illustrating the burn-in step.

A first embodiment of the present invention provides a method of manufacturing a nitride semiconductor device, which begins by fabricating a nitride semiconductor device structure. The nitride semiconductor device structure is then mounted in a package to form a nitride semiconductor device 10, which is then subjected to burn-in. FIG. 1 is a diagram illustrating the burn-in step. As shown, the nitride semiconductor device 10 is mounted in a burn-in apparatus. The nitride semiconductor device 10, which is subjected to burn-in, has an input terminal 10a, a drain terminal 10b, a gate terminal 10c, and an output terminal 10d.

The nitride semiconductor device 10 may be, e.g., an amplifier having epitaxial layers of a gallium nitride-based material or an aluminum gallium nitride-based material formed on an SiC substrate. Examples of epitaxial layers of a gallium nitride-based material include AlGaN barrier layers and GaN buffer layers. It should be noted that a source electrode, a gate electrode, a drain electrode, and an SiN protective film are formed above these epitaxial layers.

The output side (the output terminal 10d) of the nitride semiconductor device 10 is connected to the input of a tuner 12. The tuner 12 is used to adjust the load impedance at the output of the nitride semiconductor device 10. The tuner 12 is made up of, e.g., inductance (L) and capacitance (C). A load 14 which consumes RF power is connected to the output of the tuner 12. The load 14 is, e.g., a resistance.

An RF signal source 16 is connected to the input side (the input terminal 10a) of the nitride semiconductor device 10. The RF signal source 16 is used to supply an RF signal to the nitride semiconductor device 10. The nitride semiconductor device 10 and the RF signal source 16 are connected to a control unit 18. The control unit 18 measures the gate current of the nitride semiconductor device 10.

The input terminal 10a, the nitride semiconductor device 10, the output terminal 10d, the tuner 12, and the load 14 form an RF path through which RF signals are transmitted. The impedance of this RF path is typically set to 50Ω. DC voltages are applied to the drain terminal 10b and the gate terminal 10c.

If the output of the nitride semiconductor device 10 is impedance matched through the tuner 12 to the load 14 (that is, if the load impedance at the output of the nitride semiconductor device 10 is equal to the output impedance of the nitride semiconductor device 10), the RF signal applied to the input of the nitride semiconductor device 10 is amplified, e.g., approximately 10 dB, by the nitride semiconductor device 10 and passed through the tuner 12 to the load 14 which then converts the signal power into heat. In accordance with the first embodiment, however, the load impedance at the output of the nitride semiconductor device 10 is adjusted by the tuner 12 so that the nitride semiconductor device 10 exhibits a voltage standing wave ratio (VSWR) of 3 to 10. That is, the tuner 12 is configured such that the output of the nitride semiconductor device 10 is not impedance matched through the tuner 12 to the load 14, thereby generating a reflected wave in the device.

In the burn-in step, an RF signal is input to the input terminal 10a of the nitride semiconductor device 10. At the same time, a drain voltage is applied to the drain terminal 10b and a gate voltage is applied to the gate terminal 10c. The drain and gate voltages should preferably be maintained at their rated values.

Figure 2:
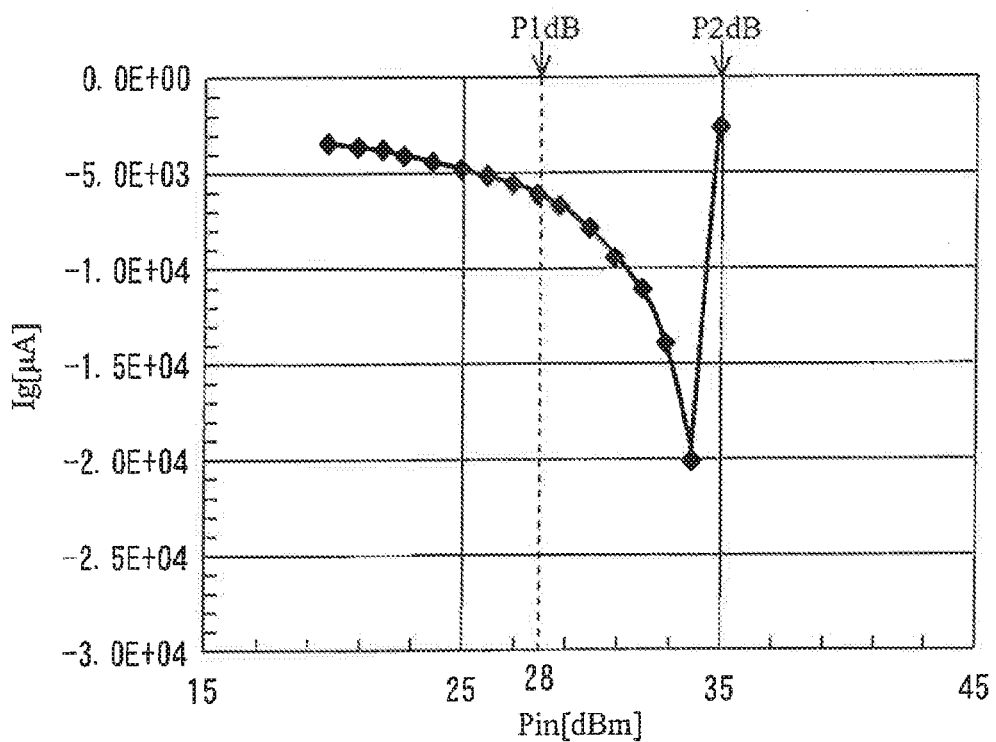
FIG. 2 is a graph illustrating changes in the gate current.

In the burn-in step, the level (Pin) of the RF signal input to the input terminal 10a is gradually increased. FIG. 2 is a graph illustrating changes in the gate current (Ig) of the nitride semiconductor device when the level (Pin) of the input RF signal is gradually increased. The gate current Ig is measured by the control unit 18. As shown, the output signal of the nitride semiconductor device 10 reaches its P1 dB compression point when Pin is increased to 28 dBm. That is, when Pin is 28 dBm, the level of the output signal is 1 dB lower than would be the case if the output signal exhibited no compression (an ideal state).

Further, if the input RF signal level Pin is gradually increased beyond 20 dBm, the gate current (which is negative) increases negatively. The reason for this is that increasing the RF signal level Pin beyond a certain point (20 dBm) results in the load curve of the nitride semiconductor device 10 (i.e., the drain voltage vs. drain current curve) becoming closed, so that an instantaneous voltage greater than the rated drain voltage is applied to the drain terminal 10b.

Further, when the input RF signal level Pin is increased to approximately 35 dBm, the gate current Ig rapidly decreases. Upon detecting this rapid decrease in Ig, the control unit 18 stops the supply of the rated gate voltage, the rated drain voltage, and the RF signal to the nitride semiconductor device 10. Specifically, the control unit 18 cuts off the supply of these rated voltages and stops the RF signal source 16. Thus, the burn-in step is ended when the control unit 18 has detected a rapid decrease in the gate current Ig. In other words, the burn-in step continues until the control unit 18 detects a rapid decrease in the gate current Ig of the nitride semiconductor device 10. The phenomenon in which the gate current Ig rapidly decreases in the burn-in step is referred to hereinafter as the "Ig rapid decrease phenomenon."

When the input RF signal level Pin is increased to approximately 35 dBm, the following events occur. The output signal of the nitride semiconductor device 10 reaches its P2 dB compression point. That is, when Pin is 35 dBm, the level of the output signal is 2 dB lower than would be the case if the output signal exhibited no compression. In this state (i.e., when Pin is 35 dBm), the drain terminal 10b receives a greater instantaneous voltage than when Pin is 20 dBm.

As a result, the nitride semiconductor device 10 experiences a high electrical stress, and its channel temperature increases. For example, if the rated drain voltage is 30 V, the instantaneous voltage applied to the drain terminal 10b when the Pin is 35 dBm is 65 V.

Further, the channel temperature of the nitride semiconductor device 10 reaches approximately 180° C. when the input RF signal level Pin is approximately 35 dBm. This is primarily due to the fact that the tuner 12 is configured such that the output of the nitride semiconductor device 10 is not impedance matched through the tuner 12 to the load 14. Thus, in the method of manufacturing a nitride semiconductor device in accordance with the first embodiment, the nitride semiconductor device is caused to experience an electrical stress and a thermal stress, thereby inducing the Ig rapid decrease phenomenon described above.

Figure 3:
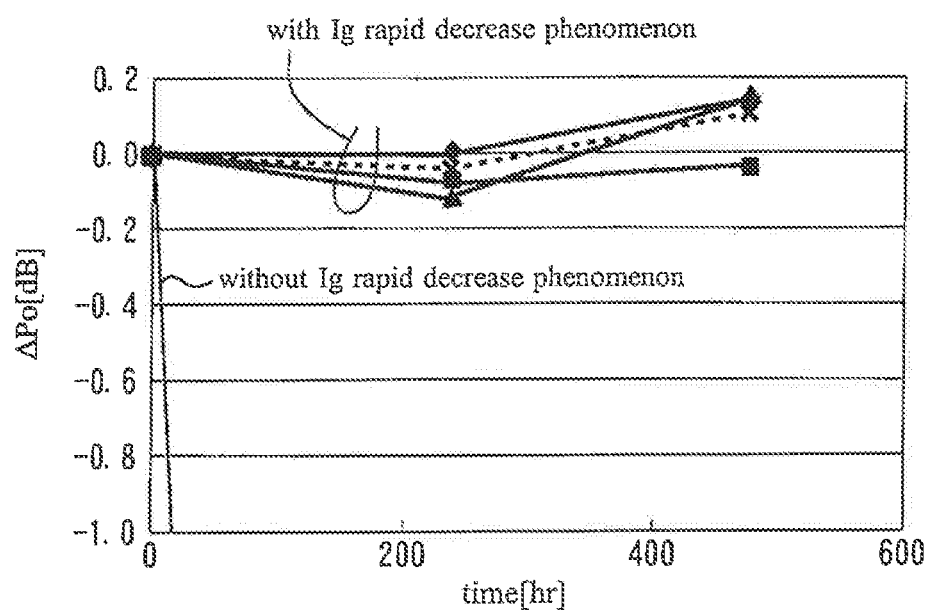
FIG. 3 is a graph showing the results of long-term reliability tests on samples.

FIG. 3 is a graph showing the results of long-term reliability tests on samples of the nitride semiconductor device 10 after the samples were subjected to burn-in. In these long-term reliability tests, an RF signal was input to each sample so that the output signal of the sample was at its P3 dB compression point, and the channel temperature of the sample was set at 330° C. In this state, the output power of the sample was measured. Each curve of FIG. 3 represents the amount of change in output power of a sample as a function of test time. The vertical axis represents the amount of change in output power $\Delta$Po, and the horizontal axis represents time. The burn-in step for one of the samples was ended before the Ig rapid decrease phenomenon described above could occur, and this sample exhibited a significant degradation in its output power after a few tens of hours of the reliability test.

The burn-in steps for the other samples were ended after the Ig rapid decrease phenomenon occurred, and these samples exhibited no significant degradation in their output power even after 480 hours of the reliability test. This means that the method of the first embodiment is capable of manufacturing a nitride semiconductor device having superior long-term reliability.

Further, after a sample was caused to experience the Ig rapid decrease phenomenon in a burn-in step, the same sample was subjected to burn-in again. During this subsequent burn-in, however, the gate current Ig of the sample did not increase and was stable. The reason for this is considered to be that the nitride semiconductor device, or sample, received an electrical stress and a thermal stress in the first burn-in step, which resulted in annealing out (or thermal removal) of crystal defects present around the gate of the device.

It should be noted that the channel temperature of the nitride semiconductor device 10 should preferably be maintained at 180° C. or more in the burn-in step in order to cause the device to experience the Ig rapid decrease phenomenon. The tuner 12 helps accomplish this. If it were not for the tuner 12, the channel temperature of the nitride semiconductor device 10 would be only approximately 30-100° C. higher than the ambient temperature (25-60° C.) in the burn-in step, since the nitride semiconductor device 10 consumes the amount of power determined by its power added efficiency (PAE). This means that the channel temperature would be only approximately 55-160° C. That is, without the tuner 12, the channel temperature of the nitride semiconductor device 10 could not be raised to 180° C. or more.

In contrast, the method of manufacturing a nitride semiconductor device in accordance with the first embodiment uses the tuner 12, which is adjusted so that the nitride semiconductor device 10 exhibits a VSWR of 3 to 10. This increases the drain current and decreases the power added efficiency of the nitride semiconductor device 10, making it possible to increase the channel temperature to a level which is approximately 150-300° C. higher than the ambient temperature (25-60° C.). This means that the channel temperature can be adjusted in the range of approximately 175-360° C. Therefore, it is easy to set the channel temperature at 180° C. or more.

It should be noted that in the burn-in step, an increase in the gate current Ig of the nitride semiconductor device 10 results in an increase in the current flowing through the gate resistance connected to the gate, so that the voltage drop across the gate resistance increases and hence the gate voltage increases positively (or becomes less negative). This means that a positive feedback loop may occur in which an increase in the gate current results in an increase in the drain current, which results in an increase in the channel temperature, which again results in an increase in the gate current, thereby degrading the nitride semiconductor device 10. In order to avoid such device degradation, the VSWR in the nitride semiconductor device 10 may be set in the range of 3-10 to prevent overheating of the channel. The data of FIG. 2 was obtained from a burn-in step in which a sample of the nitride semiconductor device 10 was caused to exhibit a VSWR of 4.9.

In the burn-in step of the method of the present embodiment, the level of the RF signal input to the input terminal of the nitride semiconductor device 10 should preferably be set such that the output signal of the device is at one of its P1 dB to P5 dB compression points. This enables a high electrical stress to be applied to the nitride semiconductor device 10 while preventing overheating of its channel, since the drain voltage increases and decreases with increase and decrease, respectively, in the level of the RF signal.

In the burn-in step of the method of manufacturing a nitride semiconductor device in accordance with the first embodiment, the level of the RF signal input to the device is gradually increased to induce the Ig rapid decrease phenomenon described above. However, if the level of the RF signal at which the nitride semiconductor device will exhibit the Ig rapid decrease phenomenon is known beforehand, the RF signal may be initially set to that level and then applied to the device. This enables the burn-in step to be completed in a short time, e.g., a few to a few tens of seconds.

The control unit 18 may be connected to the rated voltage supply unit for supplying rated voltages to the nitride semiconductor device 10, and this rated voltage supply unit may be stopped upon the occurrence of the Ig rapid decrease phenomenon described above. It should be noted that the above alterations to the first embodiment may also be made to the methods of manufacturing a nitride semiconductor device in accordance with the subsequently described embodiments.

Second Embodiment

The method of manufacturing a nitride semiconductor device in accordance with a second embodiment of the present invention has many features common to the first embodiment. Therefore, the following description of the second embodiment will be primarily limited to the differences from the first embodiment. In the burn-in step of the method of the second embodiment, the tuner 12 is adjusted so that the output impedance of the nitride semiconductor device 10 is impedance matched through the tuner 12 to the load 14. The output impedance of the nitride semiconductor device and the load impedance are, e.g. 50 Ω.

As a result of the above impedance matching, no substantial reflection occurs in the nitride semiconductor device, which would otherwise help increase the channel temperature. In order to overcome this problem, the nitride semiconductor device is heated by a heating device, e.g., a heating sheet, in the burn-in step. The burn-in step is ended after the Ig rapid decrease phenomenon has been detected. Specifically, the control unit stops the RF signal source 16, cuts off the supply of the rated voltages, and stops the heating device.

Thus, in the burn-in step of the method of manufacturing a nitride semiconductor device in accordance with the second embodiment, the tuner 12 is adjusted so that the output of the nitride semiconductor device is impedance matched through the tuner 12 to the load 14, thereby minimizing the reflection of the RF signal in the device and hence preventing degradation of the device. It should be noted that the heating device is not limited to a heating sheet, but may be any means capable of heating the nitride semiconductor device.

Third Embodiment

The method of manufacturing a nitride semiconductor device in accordance with a third embodiment of the present invention has many features common to the first embodiment. Therefore, the following description of the third embodiment will be primarily limited to the differences from the first embodiment. The method of manufacturing a nitride semiconductor device in accordance with the third embodiment includes a DC burn-in step prior to the burn-in step described above in connection with the first or second embodiment. In this DC burn-in step, a drain current of 200 mA/mm or more is applied to the nitride semiconductor device.

As a result of the DC burn-in step, some of the crystal defects present around the gate are annealed out, making it possible to slightly decrease the temperature to which the channel of the nitride semiconductor device is to be set in the subsequent burn-in step. That is, in the subsequent burn-in step, the nitride semiconductor device can be caused to experience the Ig rapid decrease phenomenon at a channel temperature which is slightly lower than 180° C. It should be noted that features of embodiments described above may be combined where appropriate.

Thus the present invention enables manufacture of a nitride semiconductor device having superior long-term reliability.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a nitride semiconductor device, said nitride semiconductor device having an input terminal, a drain terminal, a gate terminal, and an output terminal, said method comprising:
   burning in said nitride semiconductor device by heating said nitride semiconductor device while inputting an RF signal to said input terminal, applying a drain voltage to said drain terminal, and applying a gate voltage to said gate terminal, wherein heating said nitride semiconductor device includes connecting a load having a variable load impedance at said output terminal of said nitride semiconductor device and setting the load impedance such that reflection of the RF signal at the load establishes, at said nitride semiconductor device, a voltage standing wave ratio (VSWR) within a range from 3 to 10, thereby raising temperature of a channel of said nitride semiconductor device;
   continuing the burning in until said nitride semiconductor device exhibits a decrease in gate current; and
   upon the decrease in the gate current, stopping the burning in by stopping inputting of the RF signal to said input terminal, stopping applying of the drain voltage to said drain terminal, and stopping applying of the gate voltage to said gate terminal.

2. The method according to claim 1, including, in said burning-in, setting the RF signal input to said input terminal such that an output signal of said nitride semiconductor device is at one of the P1 dB to P5 dB compression points of the output signal.

3. The method according to claim 1, including, in said burning in, raising temperature of the channel of said nitride semiconductor device to at least 180° C.

4. The method according to claim 1, further comprising, prior to said burning in, in a DC burning in, applying a drain current of at least 200 mA/mm to said nitride semiconductor device.

5. The method according to claim 1, wherein said nitride semiconductor device is an amplifier including an epitaxial layer of a gallium nitride-based material or an aluminum gallium nitride-based material, on an SiC substrate.

6. A burn-in apparatus comprising:
- an RF signal source for supplying an RF signal to an input terminal of a nitride semiconductor device;
- a tuner for connection to an output terminal of the nitride semiconductor device;
- a load connected to said tuner; and
- a control unit for measuring gate current of the nitride semiconductor device while supplying a drain voltage, a gate voltage, and the RF signal respectively to a drain terminal, a gate terminal, and the input terminal of the nitride semiconductor device, and stopping supplying of the drain voltage, the gate voltage, and the RF signal to said nitride semiconductor device upon detection of a decrease in the gate current.

7. The burn-in apparatus according to claim 6, wherein the drain voltage and the gate voltage are maintained at rated values until the control unit stops the supplying of the drain voltage and the gate voltage.

\* \* \* \* \*